(12) United States Patent
Song et al.

(10) Patent No.: US 11,908,895 B2
(45) Date of Patent: Feb. 20, 2024

(54) ELECTROSTATIC DISCHARGE PROTECTION DEVICE

(71) Applicant: Samsung Electronics Co., Ltd., Suwon-si (KR)

(72) Inventors: Jongkyu Song, Incheon (KR); Jaehyun Yoo, Suwon-si (KR); Jangkyu Choi, Hwaseong-si (KR); Jin Heo, Suwon-si (KR); Changsu Kim, Hwaseong-si (KR); Chanhee Jeon, Hwaseong-si (KR)

(73) Assignee: Samsung Electronics Co., Ltd.

( * ) Notice: Subject to any disclaimer, the term of this patent is extended or adjusted under 35 U.S.C. 154(b) by 85 days.

(21) Appl. No.: 17/542,728

(22) Filed: Dec. 6, 2021

(65) Prior Publication Data

US 2022/0231126 A1 Jul. 21, 2022

(30) Foreign Application Priority Data

Jan. 21, 2021 (KR) .................. 10-2021-0008679

(51) Int. Cl.
*H01L 29/08* (2006.01)
*H01L 29/735* (2006.01)

(52) U.S. Cl.
CPC ........ *H01L 29/0821* (2013.01); *H01L 29/735* (2013.01)

(58) Field of Classification Search
CPC ............... H01L 29/0821; H01L 29/735; H01L 29/0649; H01L 29/0642; H01L 29/0646; H01L 29/0657; H01L 29/0817; H01L 29/0808; H01L 29/0804; H01L 29/0878; H01L 29/0882; H01L 29/1004; H01L 29/1008; H01L 29/1095; H01L 29/41708; H01L 29/42304; H01L 29/737; H01L 29/66318; H01L 29/66174;
(Continued)

(56) References Cited

U.S. PATENT DOCUMENTS 6,472,286 B1  10/2002  Yu
7,795,047 B1   9/2010  Vashchenko et al.
(Continued)

FOREIGN PATENT DOCUMENTS

KR   20160069166 A   6/2016
KR   20170025685 A   3/2017

OTHER PUBLICATIONS

Chang et al. "2.4-GHz 7.4-mW 300-kHz Flicker-Noise-Corner Direct Conversion Receiver Using 0.18 μm CMOS and Deep-N-Well NPN BJT" 2013 IEEE Radio and Wireless Symposium (Jan. 2013).

*Primary Examiner* — Natalia A Gondarenko
(74) *Attorney, Agent, or Firm* — Myers Bigel, P.A.

(57) ABSTRACT

An electrostatic discharge protection device includes: an emitter region disposed on a semiconductor substrate; a base region surrounding the emitter region; a first collector region surrounding the base region; a second collector region surrounding the first collector region; a second conductivity-type drift region below the emitter region, and being deeper than the base region; a second conductivity-type well region disposed below the base region, and having a junction interface with the second conductivity-type drift region; and a plurality of isolation portions disposed between the emitter region, the base region, and the first collector region and the second collector region.

18 Claims, 11 Drawing Sheets

(58) Field of Classification Search
CPC ........... H01L 29/66189; H01L 29/6625; H01L 29/66242; H01L 29/66234–66348; H01L 29/73–7378; H01L 29/7375; H01L 29/739–7398; H01L 27/0259; H01L 27/0262; H01L 27/0274; H01L 27/0277; H01L 27/067; H01L 27/082; H01L 27/0928; H01L 27/1203; H01L 2924/1305–13056; H01L 27/04
USPC ........ 257/197, 198, 369, 592, 21.35, 21.352
See application file for complete search history.

(56) References Cited

U.S. PATENT DOCUMENTS

| | | | |
|---|---|---|---|
| 9,231,403 | B2 | 1/2016 | Edwards et al. |
| 9,666,700 | B2 | 5/2017 | Hebert et al. |
| 2004/0169233 | A1* | 9/2004 | Yamamoto .......... H01L 29/7302 257/361 |
| 2013/0062662 | A1* | 3/2013 | Tsujiuchi ............ H01L 27/0207 257/140 |
| 2015/0243770 | A1* | 8/2015 | Hebert .................. H01L 29/732 257/586 |
| 2016/0163690 | A1 | 6/2016 | Ko et al. |
| 2017/0062406 | A1 | 3/2017 | Ko et al. |
| 2017/0170304 | A1* | 6/2017 | Kim .................... H01L 29/7322 |
| 2018/0012883 | A1 | 1/2018 | Ko et al. |
| 2018/0082994 | A1* | 3/2018 | Han .................... H01L 27/0274 |

\* cited by examiner

II-II'

III-III'

ELECTROSTATIC DISCHARGE PROTECTION DEVICE

CROSS-REFERENCE TO RELATED APPLICATION(S)

This application claims benefit of Korean Patent Application No. 10-2021-0008679 filed on Jan. 21, 2021, with in the Korean Intellectual Property Office, the disclosure of which is incorporated herein by reference in its entirety.

FIELD

The present inventive concept relates to an electrostatic discharge protection device.

BACKGROUND

Semiconductor integrated circuits are very sensitive to electrostatic discharge (ESD) pulses, and are particularly susceptible to physical damage by high voltages and currents generated by electrostatic discharge pulses. Since the size of semiconductor devices is gradually being reduced, the magnitude of the voltage that the semiconductor device can withstand without damage is also being reduced. Accordingly, in the input-output terminals of many semiconductor devices, an electrostatic discharge protection device is disposed for protection from damage caused by electrostatic discharge pulses.

The electrostatic discharge protection device serves to quickly remove the electrostatic discharge pulse having a high voltage and a high current when applied to the semiconductor device.

SUMMARY

An aspect of the present disclosure is to provide an electrostatic discharge protection device.

According to an aspect of the present inventive concept, an electrostatic discharge protection device includes: an emitter region having first conductivity-type on a semiconductor substrate; a base region having a second conductivity-type opposite to the first conductivity-type, and surrounding the emitter region on the semiconductor substrate; a first collector region having the first conductivity-type surrounding the base region on the semiconductor substrate; a second collector region having the first conductivity-type surrounding the first collector region on the semiconductor substrate; a second conductivity-type drift region surrounded by the base region, wherein the second conductivity-type drift region is between the emitter region and the semiconductor substrate, and extends toward the semiconductor substrate deeper than the base region; a second conductivity-type well region between the base region and the semiconductor substrate, and having a junction interface with the second conductivity-type drift region; and a plurality of isolation portions between the emitter region and the base region, between the base region and the first collector region, and between the first collector region and the second collector region, respectively.

According to an aspect of the present inventive concept, an electrostatic discharge protection device includes: an emitter region on a semiconductor substrate; a base region surrounding the emitter region on the semiconductor substrate; a first collector region surrounding the base region on the semiconductor substrate; a second collector region surrounding the first collector region on the semiconductor substrate; a first conductivity-type well region surrounding both the first collector region and the second collector region, and having a first impurity concentration; a first conductivity-type drift region surrounding the first conductivity-type well region, and having a second impurity concentration that is lower than the first concentration; a second conductivity-type well region between the base region and the semiconductor substrate, extending toward the semiconductor substrate deeper than the first conductivity-type drift region, and having a junction interface with the first conductivity-type drift region; and a plurality of isolation portions between the emitter region and the base region, between the base region and the first collector region, and between the first collector region and the second collector region, respectively.

According to an aspect of the present inventive concept, an electrostatic discharge protection device includes: an emitter region on a semiconductor substrate; a base region surrounding the base region on the semiconductor substrate; a first collector region surrounding the base region on the semiconductor substrate; a second collector region surrounding the first collector region on the semiconductor substrate; a first conductivity-type drift region surrounding both the first collector region and the second collector region and extending between the first and second collector regions and the semiconductor substrate; a second conductivity-type drift region surrounding the emitter region and extending between the emitter region and the semiconductor substrate; a second conductivity-type deep well between the base region and the semiconductor substrate, extending toward the semiconductor substrate deeper than the first and second conductivity-type drift regions, having first and second junction interfaces with the first and second conductivity-type drift regions, respectively, and having a first impurity concentration; a second conductivity-type shallow well surrounding the base region in the second conductivity-type deep well and having a second impurity concentration that is higher than the first impurity concentration; and a plurality of isolation portions between the emitter region and the base region, between the base region and the first collector region, and between the first collector region and the second collector region, respectively. The base region comprises a high concentration doped region, and a second conductivity-type body region connecting the high concentration doped region and the second conductivity-type deep well below the high concentration doped region, the second conductivity-type body region having a third impurity concentration, higher than the first impurity concentration and lower than the second impurity concentration.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
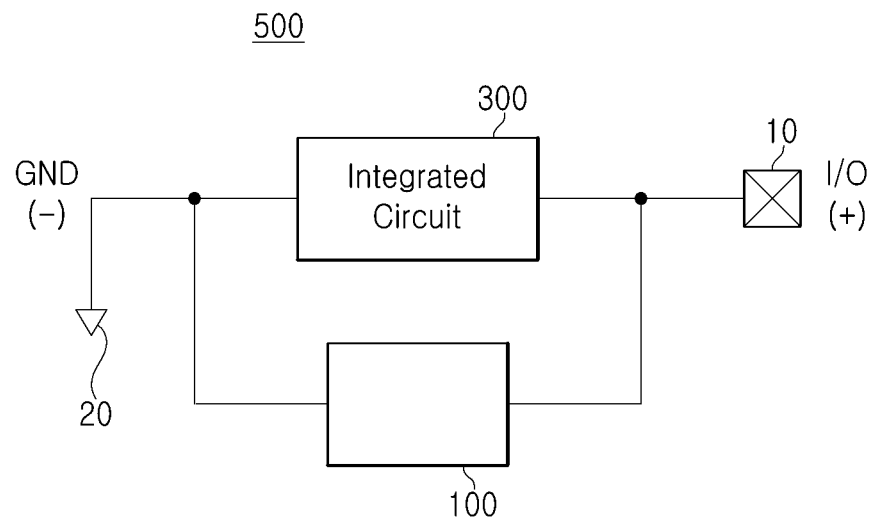
FIG. 1 is a simplified circuit diagram of a semiconductor device including a general electrostatic discharge protection device.

FIG. 1 is a simplified circuit diagram of a semiconductor device including a general electrostatic discharge protection device.

Referring to FIG. 1, an electrostatic discharge protection device 100 may be disposed between an input/output (I/O) terminal 10 and a ground terminal 20 to which a ground voltage is applied. An integrated circuit device 300 may be protected from unwanted electrostatic discharge pulses by the electrostatic discharge protection device 100.

Specifically, the electrostatic discharge protection device 100 may protect the integrated circuit device 300 connected to the input/output terminal 10 and the ground terminal 20 from the electrostatic discharge pulse. The integrated circuit device 300 may include various devices including electrical elements. The electrostatic discharge protection device 100 that may be employed here is illustrated in FIGS. 2 to 4.

Figure 2:
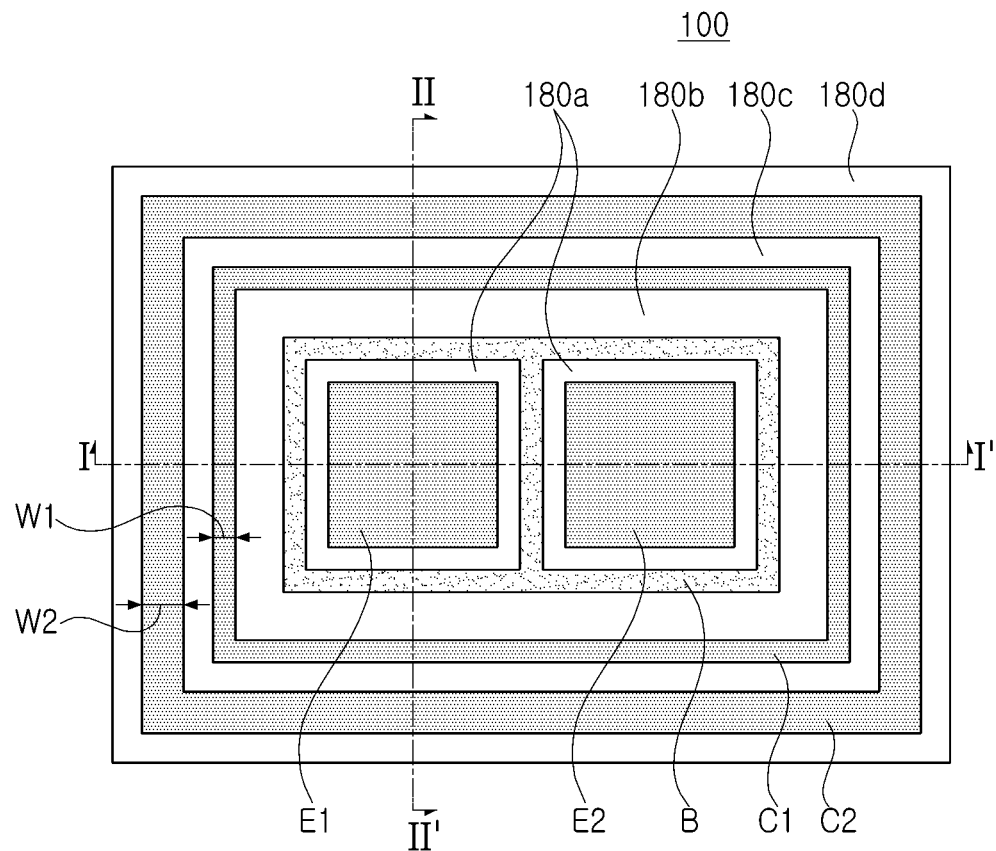
FIG. 2 is a plan view of an electrostatic discharge protection device according to an example embodiment of the present inventive concept.
Figure 3A:
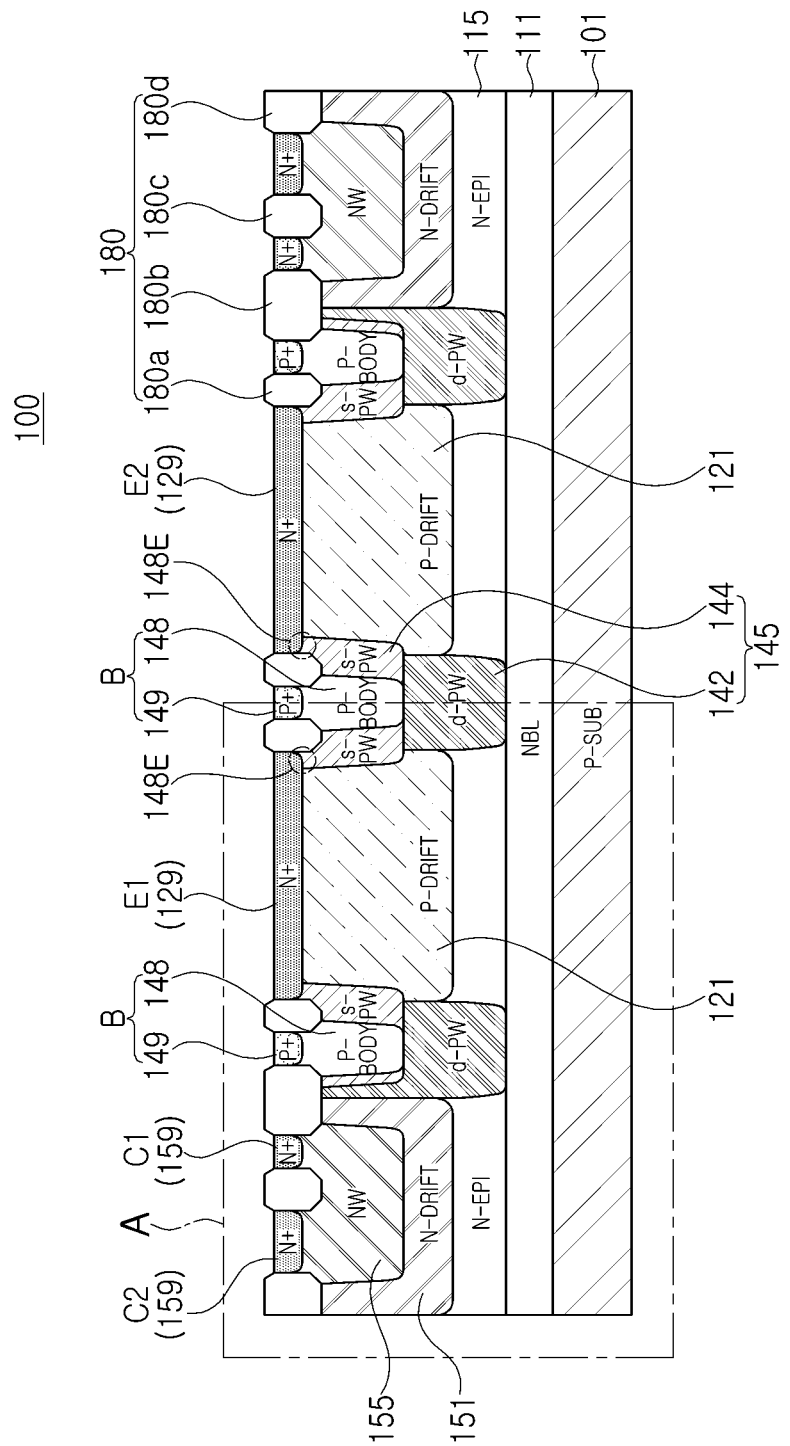
FIGS. 3A and 3B are cross-sectional views of the electrostatic discharge protection device of FIG. 2 taken along lines I-I' and II-II', respectively.
Figure 3B:
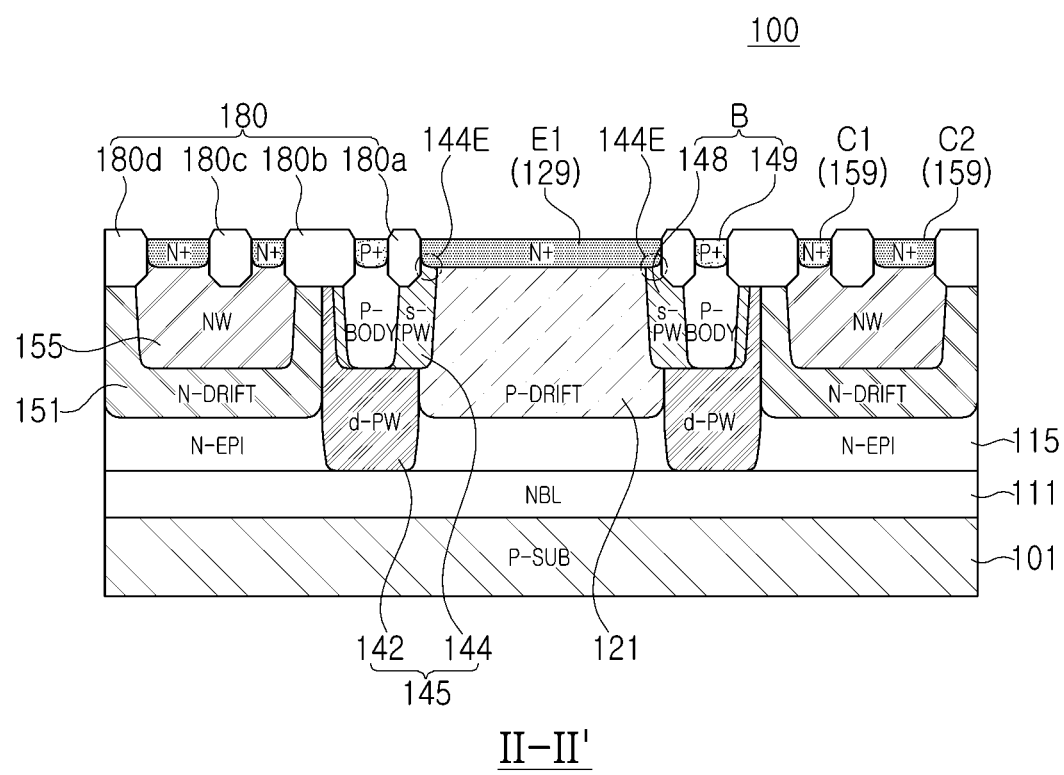
Figure 4:
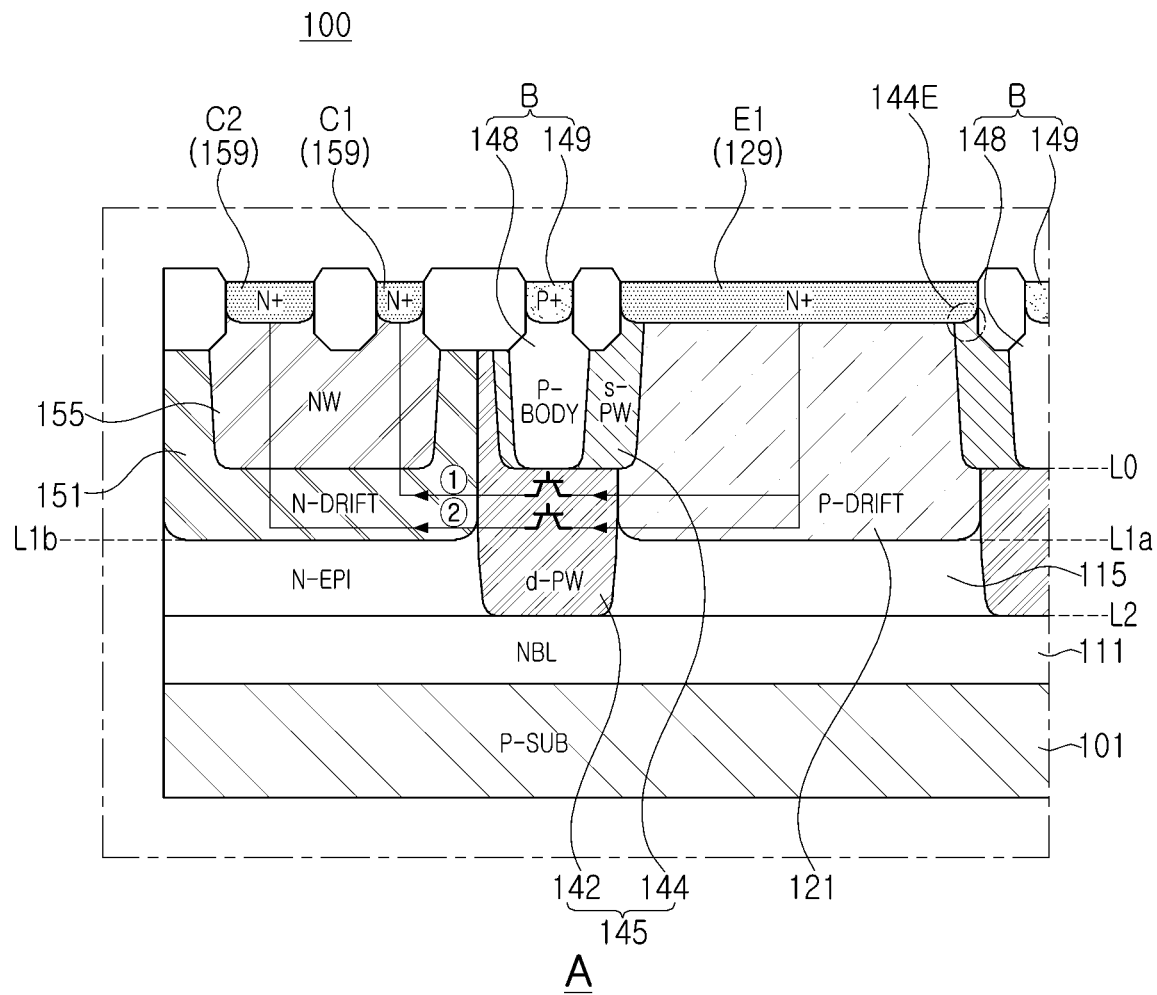
FIG. 4 is an enlarged cross-sectional view of portion A of the electrostatic discharge protection device of FIG. 2.

FIG. 2 is a plan view of an electrostatic discharge protection device according to an example embodiment of the present inventive concept, and FIGS. 3A and 3B are cross-sectional views of the electrostatic discharge protection device of FIG. 2 taken along lines I-I' and II-II', respectively.

Referring to FIGS. 2, 3A, and 3B, the electrostatic discharge protection device 100 according to the present example embodiment may include a first conductivity-type (e.g., n-type) first emitter region E1 and a first conductivity-type (e.g., n-type) second emitter region E2 disposed on a semiconductor substrate 101 and having a first high concentration doped region 129, respectively, a base region B having a second high concentration doped region 149, a first collector region C1 and a second collector region C2 having a third high concentration doped region 159, respectively, and a plurality of isolation layers or regions 180 disposed between the first emitter region and the second emitter region E1 and E2, the base region B, and the first collector region C1 and the second collector region C2. The terms "first," "second," "third," etc. may be used herein merely to distinguish one element, layer, or region from another.

The first to third high concentration doped regions 129, 149, and 159 may be provided as contact regions. Here, the first and third high concentration doped regions 129 and 159 refer to regions doped with a high concentration (e.g., $5 \times 10^{14}/cm^2$ or more) of a first conductivity type impurity (e.g., an n-type impurity), and the second high concentration doped region 149 refers to a region doped with a high concentration (e.g., $5 \times 10^{14}/cm^2$ or more) of a second conductivity-type impurity (e.g., a p-type impurity).

In a planar or plan view (see FIG. 2), the first conductivity-type (e.g., n-type) first emitter region E1 and the first conductivity-type (e.g., n-type) second emitter region E2 are arranged to be separated in one direction. The base region B may surround each of the first emitter region and the second emitter region E1 and E2, and may be arranged to be separated from the first conductivity-type (e.g., n-type) first emitter region E1 and the first conductivity-type (e.g., n-type) second emitter region E2 by a first isolation 180a. The term "surround" as used herein may include partially- and completely-surrounding arrangements. The first collector region C1 is arranged to surround the base region B, and the second collector region C2 is arranged to surround the first collector region C1. The base region B and the first collector region C1 and the second collector region C2 may have a closed curve shape, respectively, and second to fourth isolations 180b, 180c, and 180d may be disposed between the base region B and the first collector region C1, between the first collector region C1 and the second collector region C2, and an outside or periphery of the second collector region C2, respectively. The plurality of isolation portions 180 may be a field oxide film or a shallow trench isolation (STI). For example, the plurality of isolation portions or regions 180 may include a silicon oxide film.

An effect of improving emitter injection efficiency may be expected by or based on an area ratio of the emitter regions E1 and E2, the base region B, and the collector regions according to this arrangement. In addition, a stable and high ESD current (It2) may be secured by using the first collector region C1 and the second collector region C2. This will be described later with reference to FIGS. 6 and 7. In the present example embodiment, while maintaining the common base region B (i.e., one trigger), and by providing the first conductivity-type (e.g., n-type) first emitter region E1 and the first conductivity-type (e.g., n-type) second emitter region E2 additionally, a current toward the first collector region C1 and the second collector region C2 may be dispersed.

Referring to FIGS. 3A and 3B, the semiconductor substrate 101 may include a buried layer 111 covering an upper surface thereof, and a first conductivity-type epitaxial layer 115 grown from the buried layer 111. The semiconductor substrate 101 may be, for example, a silicon substrate, a germanium substrate, or a silicon-germanium substrate. In the present example embodiment, the semiconductor substrate 101 may be a second conductivity-type (e.g., p-type) substrate. The buried layer 111 may have a first conductivity-type (e.g., n-type) region doped with a high concentration. For example, the buried layer 111 may have an N++ type, and may have a higher impurity concentration than other doped regions. The epitaxial layer 115 may have a first conductivity-type (e.g., n-type) region doped with a low concentration. For example, the epitaxial layer 115 may have an N-type and may have a lower impurity concentration than other doped region. The buried layer 111 and the epitaxial layer 115 may be silicon layers.

In the epitaxial layer 115, a first conductivity-type drift region 151 may be disposed below the first collector region C1 and the second collector region C2, and a second conductivity-type drift region 121 may be disposed below the first conductivity-type (e.g., n-type) first emitter region E1 and the first conductivity-type (e.g., n-type) second emitter region E2, respectively. The second conductivity-type drift region 121 employed in the present example embodiment may at least be formed to be deeper than the base region B. As shown in FIG. 4, a bottom level L1a of the second conductivity-type drift region 121 may be located lower than a bottom level L0 of a base region B. In the present example embodiment, the base region B may include a second conductivity-type body region 148 together with the second high concentration region 149. Similarly thereto, a bottom level L1b of the first conductivity-type drift region 151 may be located lower than the bottom level L0 of the base region B.

Each of the first and second conductivity-type drift regions 151 and 121 may have a low concentration doped region (e.g., $1\times10^{11}/cm^2$ to $1\times10^{13}/cm^2$). In some example embodiments, a concentration of the first conductivity-type drift region 151 may be in a range of $5\times10^{11}/cd$ to $5\times10^{12}/cm^2$, and the second conductivity-type drift region may be in a range of $1\times10^{12}/cm^2$ to $1\times10^{13}/cm^2$.

The electrostatic discharge protection device 100 according to the present example embodiment may include a second conductivity-type well region 145 surrounding the base region B below the base region B. The second conductivity-type well region 145 may be disposed between the first conductivity-type drift region 151 and the second conductivity-type drift region 121 and may be configured to have a junction interface with the first and second conductivity-type drift regions 151 and 121, respectively.

The second conductivity-type well region 145 employed in the present example embodiment may include a second conductivity-type deep well 142 having a junction interface with the first and second conductivity-type drift regions 151 and 121, respectively, and a second conductivity-type shallow well 144 surrounding the base region B in the second conductivity-type deep well 142. The second conductivity-type deep well 142 may have a first concentration, and the second conductivity-type shallow well 144 may have a second concentration, higher than the first concentration. A first concentration of the second conductivity-type deep well 142 may be higher than the concentration of the second conductivity-type drift region 121. In some example embodiments, the first concentration of the second conductivity-type deep well 142 may be in a range of $2.5\times10^{12}/cm^2$ to $5\times10^{12}/cm^2$, and the second concentration of the second conductivity-type shallow well 144 may be in a range of $2.5\times10^{13}/cm^2$ to $5\times10^{13}/cm^2$.

Under the above-described concentration conditions of the second conductivity-type regions 121, 142, and 144, the second conductivity-type drift region 121 may have a junction interface with a second conductivity-type shallow well 144, but main current paths ① and ② may be formed deeper through junction interfaces of the second conductivity-type deep well 142 in the second conductivity-type drift region 121.

Referring to FIG. 4, the electrostatic discharge protection device 100 according to the present example embodiment may be driven similar to two lateral bipolar junction transistors (L-BJT), defining the two current paths ① and ② facing the first collector region C1 and the second collector region C2, respectively. It can be understood that a lateral BJT on the second current path ② is driven secondarily after a lateral BJT in the first current path ① is driven primarily. As described above, the electrostatic discharge protection device 100 may stably secure a relatively high ESD current It2 by an additionally driven BJT (see FIG. 6).

In addition, since the second current path ② is longer than the first current path ①, the resistance may be relatively high. Accordingly, as in the present example embodiment, the second collector region C2 may be configured to have a width w2, greater than the width w1 of the first collector region C1.

The second conductivity-type deep well 142 may be formed deeper than the first and second conductivity-type drift regions 151 and 121 to ensure a sufficient junction interface. In the present example embodiment, as shown in FIG. 4, the bottom level L2 of the second conductivity-type deep well 142 may be located in an epitaxial layer 115 or on the buried layer 111 through the epitaxial layer. In addition, in the present example embodiment, the second conductivity-type shallow well 144 may have a portion 144E extending downwardly of edge portions of the first conductivity-type (e.g., n-type) first emitter region E1 and the first conductivity-type (e.g., n-type) second emitter region E2. In a planar view, the first conductivity-type (e.g., n-type) first emitter region E1 and the first conductivity-type (e.g., n-type) second emitter region E2 may partially overlap the second conductivity-type shallow well 144.

The base region B may be configured to come into contact with the second conductivity-type deep well 142 through the second conductivity-type shallow well 144. As described above, the base region B may include a second conductivity-type body region 148 connected to the second conductivity-type deep well 142 within the second conductivity-type shallow well 144. The second conductivity-type body region 148 may have a third concentration, lower than the second concentration. For example, the third concentration may be in a range of $1\times10^{13}/cm^2$ to $3.5\times10^{13}/cm^2$. The second conductivity-type body region 148 and the second conductivity-type deep well 142 may serve as a common trigger for multi-emitters E1 and E2 and multi-collectors C1 and C2.

In the present example embodiment, a first conductivity-type well 155 may be disposed so as to surround the first collector region C1 and the second collector region C2 in the first conductivity-type drift 151 in common. The first conductivity-type well 155 may be surrounded by the first conductivity-type drift region 151. Although not limited thereto, a concentration of the first conductivity-type drift region 151 may be in a range of $5\times10^{11}/cm^2$ to $1\times10^{12}/cm^2$, and a concentration of the first conductivity-type well may be in a range of $1\times10^{13}/cm^2$ to $5\times10^{13}/cm^2$.

As described above, according to the present example embodiment, by forming deep bonding with the second conductivity-type deep well below the first conductivity-type (e.g., n-type) first emitter region E1 and the first conductivity-type (e.g., n-type) second emitter region E2 and the second conductivity-type deep well below the base region B, and properly controlling their impurity concentration, a desired ESD current It2 may be secured together with a high holding voltage Vh.

As described above, the electrostatic discharge protection device according to the present example embodiment may operate as a multi BJT having a common base (one trigger) by employing a multi-collector in a lateral BJT structure (e.g., NPN BJT structure), and as a result, a high ESD current may be stably secured. This effect will be described with reference to FIGS. 5 to 7.

Figure 5:
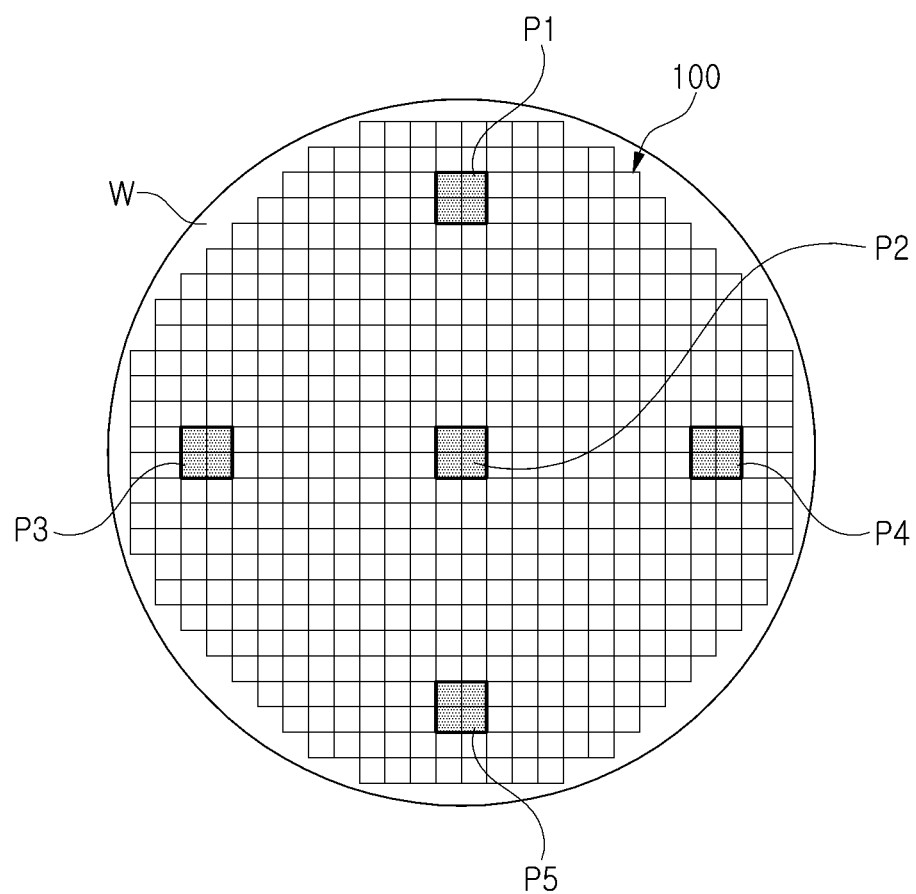
FIG. 5 is a schematic plan view illustrating a wafer on which a plurality of electrostatic discharge protection devices are manufactured.
Figure 6:
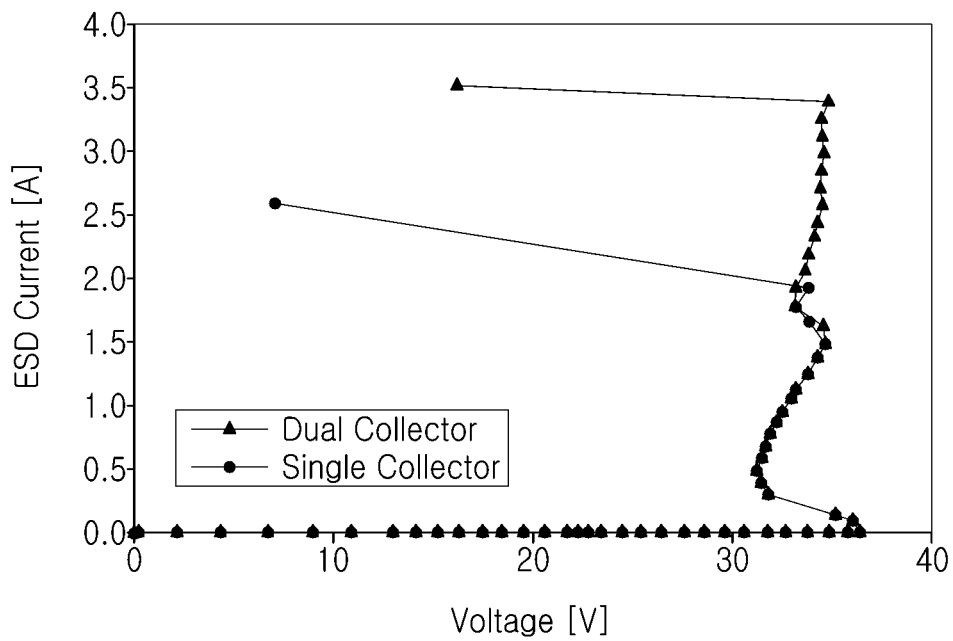
FIG. 6 is a graph illustrating an ESD current of an electrostatic discharge protection device according to a wafer region.

FIG. 5 is a schematic plan view illustrating a wafer on which a plurality of electrostatic discharge protection devices are manufactured, and FIG. 6 is a graph illustrating an ESD current of the electrostatic discharge protection device according to a wafer region.

Referring to FIG. 5, a wafer W on which a plurality of electrostatic discharge protection devices 100 are formed is shown. In an example embodiment, an electrostatic discharge protection device having a dual collector structure, such as the electrostatic discharge protection device 100 shown in FIGS. 2 to 4, was manufactured on the wafer W. In the Comparative example, on a further wafer W, an electrostatic discharge protection device 100' having the same structure as the electrostatic discharge protection device 100 according to the Example, but employing a single collector structure instead of a dual collector structure was manufactured by the same process.

First, referring to FIG. 6, a current change according to the voltage according to the electrostatic discharge protection devices of Example (dual collector) and Comparative example (single collector) sampled at the specific same location P3 was measured. Since the electrostatic discharge protection devices according to the two examples have a second conductivity-type doped structure below the base region and the emitter region and an impurity concentration, each holding voltage (Vh) appeared to be at a similar level of about 30V or more, but it can be seen that the electrostatic discharge protection device according to the example embodiment has an ESD current (about 3 A), higher than the ESD current (about 2 A) of the electrostatic discharge protection device according to the Comparative example.

Figure 7:
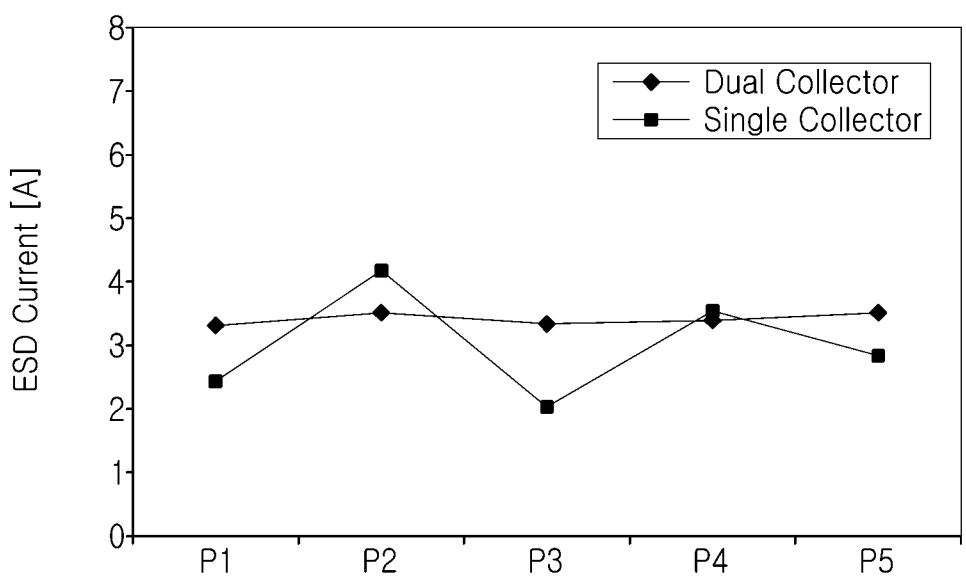
FIG. 7 is a graph illustrating a change in an ESD current according to an applied voltage.

Meanwhile, an ESD current (It2) was measured by sampling the electrostatic discharge protection devices at different locations P1, P2, P3, P4, and P5 shown in FIG. 5 on each wafer, and was shown in the graph of FIG. 7.

Referring to FIG. 7, it is illustrated that the electrostatic discharge protection device 100 of the dual collector structure according to the Example has a somewhat high and constant ESD current of about 3 A regardless of a manufacturing location thereof, whereas an electrostatic discharge protection device of the single collector structure according to Comparative example has a significantly different ESD current deviation depending on the location thereof. That is, in the case of the Comparative example, the electrostatic discharge protection devices in some locations P2 and P4 have relatively high ESD currents (about 3 A or more), but it was found that the ESD current of the electrostatic discharge protection devices at other locations P1, P3, and P5 is less than 3 A, and is 2 A, which are low. In this case, since the electrostatic discharge protection device according to the Comparative example is used with the lowest ESD current of 2 A, it can be seen that the ESD current according to the Comparative example is significantly reduced further than the ESD current according to the Example in an effective aspect.

As described above, the electrostatic discharge protection device according to the present inventive concept may implement a high holding voltage (Vh) in a lateral bipolar junction transistor structure, and by introducing a multi-collector, as shown in FIGS. 6 and 7, the electrostatic discharge protection device may secure a stable and high ESD current.

Figure 8:
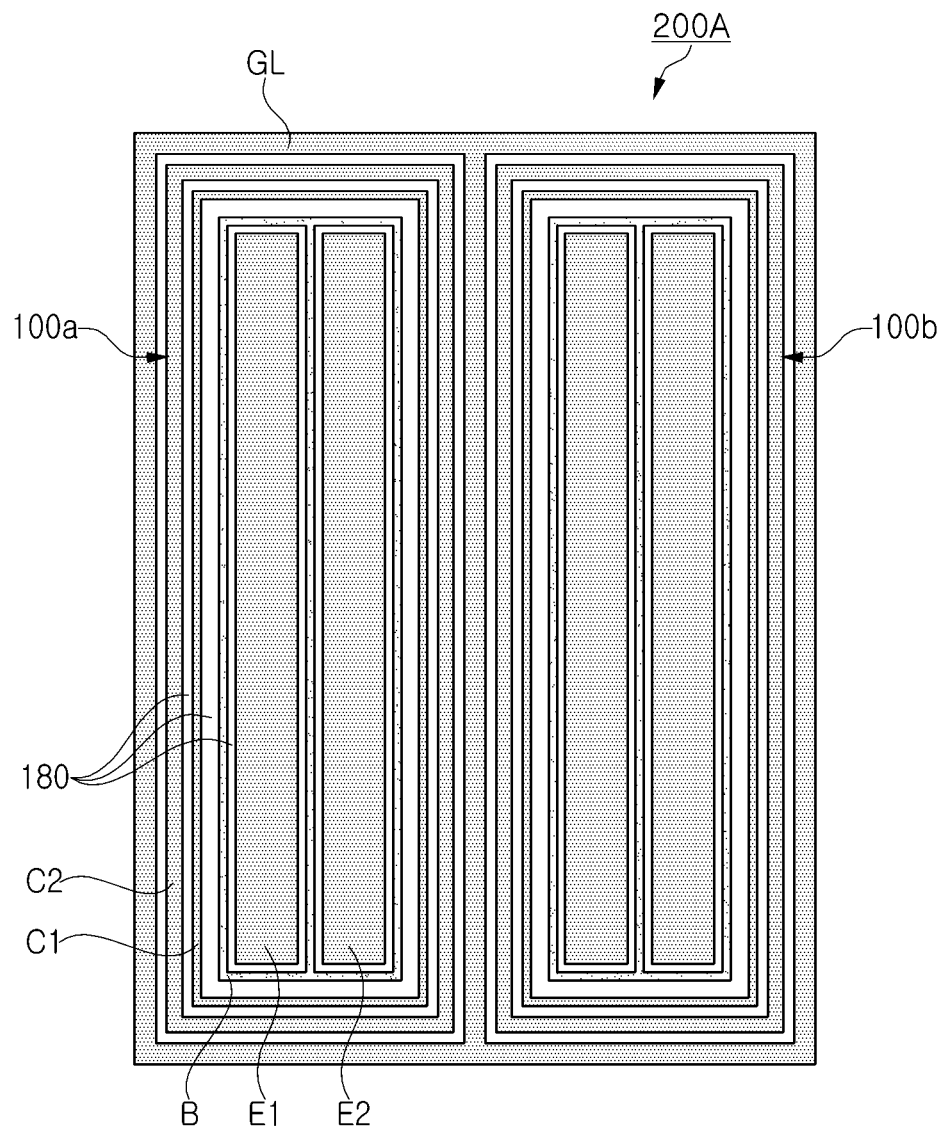
FIGS. 8 and 9 are plan views illustrating an electrostatic discharge protection device having a plurality of cell arrays.
Figure 9:
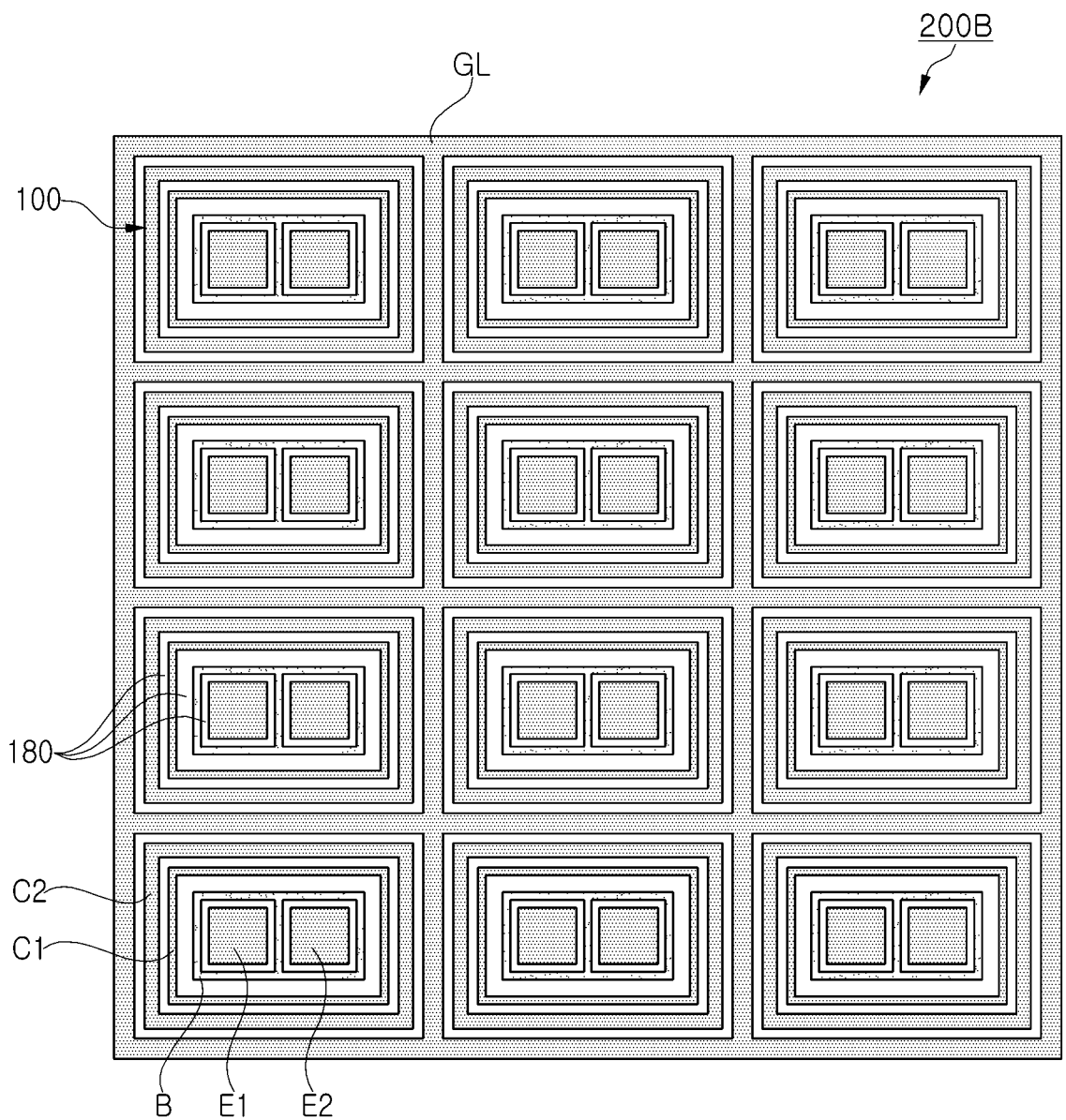

Since the electrostatic discharge protection device according to the present inventive concept has a low on-resistance after triggering, a multi-array structure is possible, thereby securing a linear ESD current characteristic. FIGS. 8 and 9 illustrate an electrostatic discharge protection device having a plurality of cell arrays.

First, referring to FIG. 8, an electrostatic discharge protection device 200A according to the present example embodiment may include first and second cells 100a and 100b. Each of the first and second cells 100a and 100b has a structure, similar to that of the electrostatic discharge protection device 100 shown in FIGS. 2 to 4, respectively, and is illustrated in a form having a rectangular structure extending in one direction.

The first and second cells 100a and 100b may respectively include a first conductivity-type (e.g., n-type) first emitter region E1 and a first conductivity-type (e.g., n-type) second emitter region E2 separated from each other, a second conductivity-type (e.g., p-type) base region B surrounding each of the first conductivity-type (e.g., n-type) first emitter region E1 and the first conductivity-type (e.g., n-type) second emitter region E2, the first conductivity-type first collector region C1 surrounding the base region B, and the first conductivity-type second collector region C2 surrounding the first collector region C1.

An electrostatic discharge protection device 200A according to the present example embodiment may include a guard ring region GL at a periphery of each of the first and second cells 100a and 100b. The guard ring region GL employed in the present example embodiment may be configured to completely surround each of the first and second cells 100a and 100b. The guard ring region GL may perform a function of discharging the ESD back to the outside when ESD current flows into the first and second cells 100a and 100b. For example, the guard ring region GL may include a region doped with a high concentration of first conductivity-type impurities (e.g., n-type impurities).

Referring to FIG. 9, an electrostatic discharge protection device 200B according to the present example embodiment may include a plurality (e.g., 12) cells 100 arranged in 3×4. Each of the plurality of cells 100 may be similar to or the same as the electrostatic discharge protection device 100 shown in FIGS. 2 to 4.

The plurality of cells 100 may respectively include a first conductivity-type (e.g., n-type) first emitter region E1 and a first conductivity-type (e.g., n-type) second emitter region E2 disposed on a semiconductor substrate and separated from each other, a second conductivity-type (e.g., p-type) base region B, surrounding each of the first conductivity-type (e.g., n-type) first emitter region E1 and the first conductivity-type (e.g., n-type) second emitter region E2, the first conductivity-type first collector region C1 surrounding the base region B, and the first conductivity-type second collector region C2 surrounding the first collector region C1.

Similar to the previous example embodiment, the electrostatic discharge protection device 200B according to the present example embodiment may include a guard ring region GL surrounding each of the first and second cells 100a and 100b, and the guard ring region GL may include a region doped with a high concentration of first conductivity-type impurities (e.g., n-type impurities).

As described above, since the cells employed in the present example embodiment have the structure of the electrostatic discharge protection device according to the present example embodiment, while implementing a high holding voltage Vh, a stable and high ESD current can be secured by a multi-collector. Therefore, since each cell has low ON resistance after triggering, it is possible to ensure a linear ESD current characteristic even in the multi-array structure shown in FIGS. 8 and 9.

Figure 10:
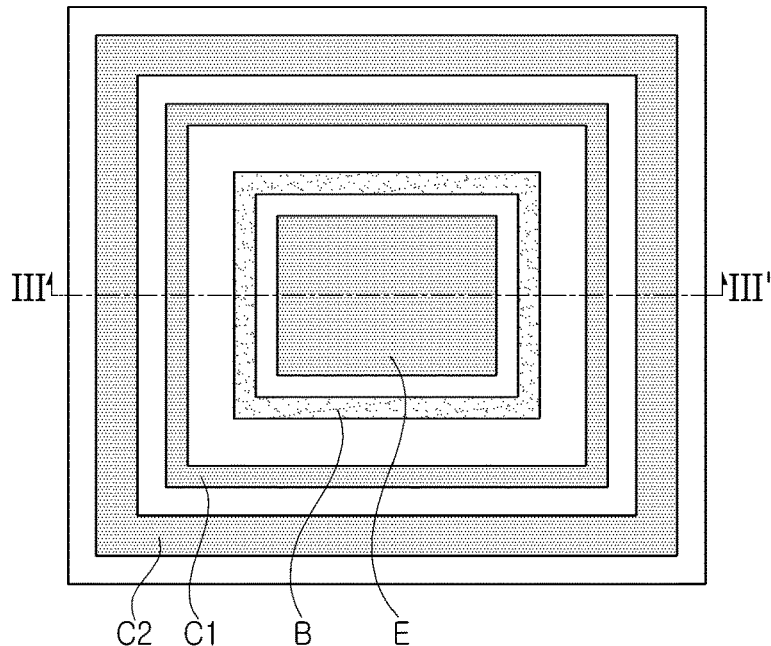
FIG. 10 is a plan view of an electrostatic discharge protection device according to an example embodiment of the present inventive concept.
Figure 11:
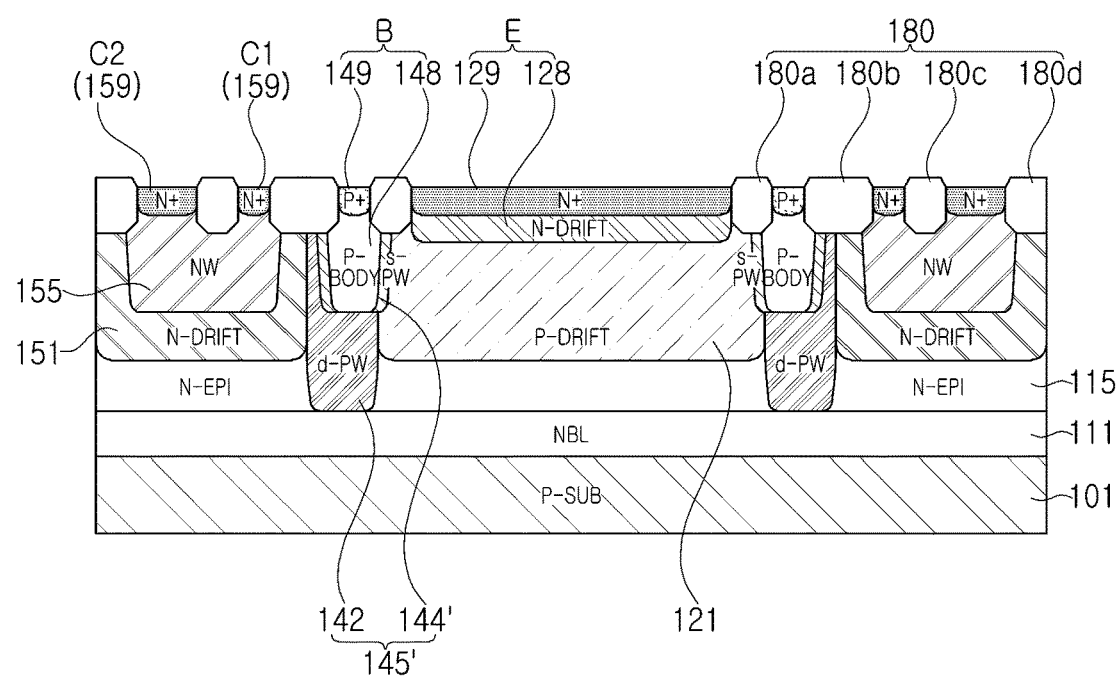
FIG. 11 is a cross-sectional view of the electrostatic discharge protection device of FIG. 10 taken along line III-III'.

FIG. 10 is a plan view of an electrostatic discharge protection device according to an example embodiment of the present inventive concept, and FIG. 11 is a cross-sectional view of the electrostatic discharge protection device of FIG. 10 taken along line III-III'.

Referring to FIGS. 10 and 11, in the electrostatic discharge protection device 100A according to the present example embodiment, it can be understood as a structure, similar to that of the embodiment shown in FIGS. 2 to 4, except that an emitter region E is composed of a single structure, an n-type drift 128 below the emitter region E is further included, and a second conductivity-type well region 145' below the base region B has a different structure. Accordingly, the description of the example embodiment shown in FIGS. 2 to 4 may be similar to or combined with the description of this embodiment unless otherwise specified.

The electrostatic discharge protection device 100A according to the present embodiment may include one emitter region E. The base region B may be formed to surround the emitter region E.

The emitter region E employed in the present example embodiment may include a first conductivity-type drift region 128 located in the second conductivity-type drift region 121, together with a first high concentration doped region 129. The first high-concentration doped region 129 may be a region doped with a first conductivity-type impurity (e.g., n-type impurity) at a high concentration (e.g., $5 \times 10^{14}/cm^2$ or more). For example, a concentration of the first conductivity-type drift region 128 may be in a range of $5 \times 10^{11}/cm^2$ to $5 \times 10^{12}/cm^2$, and a concentration of the second conductivity-type drift region 121 may be in a range of $1 \times 10^{12}/cm^2$ to $1 \times 10^{13}/cm^2$.

In the present example embodiment, a second conductivity-type well region 145' below the base region B includes a second conductivity-type deep well 142 having a junction interface with the second conductivity-type drift region 121, and a second conductivity-type shallow well 144' surrounding the base region B in the second conductivity-type deep well 142. A first concentration of the second conductivity-type deep well 142 may be higher than the concentration of the second conductivity-type drift region 121. In some example embodiments, the first concentration of the second conductivity-type deep well 142 may be in a range of $2.5 \times 10^{12}/cm^2$ to $5 \times 10^{12}/cm^2$, and a second concentration of the second conductivity-type shallow well 144' may be in a range of $2.5 \times 10^{14}/cm^2$ to $5 \times 10^{13}/cm^2$.

In the present example embodiment, unlike the previous example embodiment, the second conductivity-type shallow well 144' does not have a region extending downwardly of the emitter region E. As shown in FIG. 11, the second conductivity-type shallow well 144' may be formed to surround only the base region B without overlapping the emitter region E in a planar view.

Figure 12:
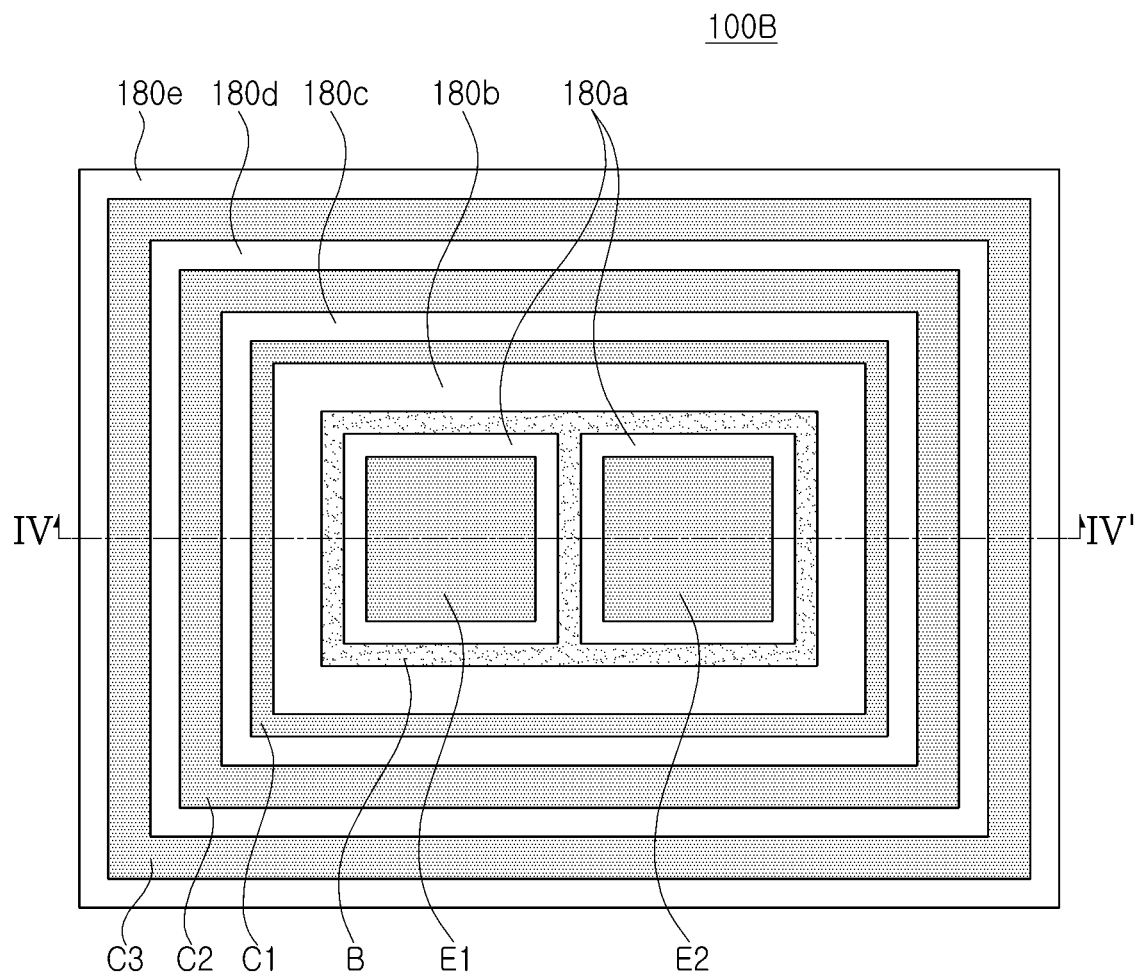
FIG. 12 is a plan view of an electrostatic discharge protection device according to an example embodiment of the present inventive concept.
Figure 13:
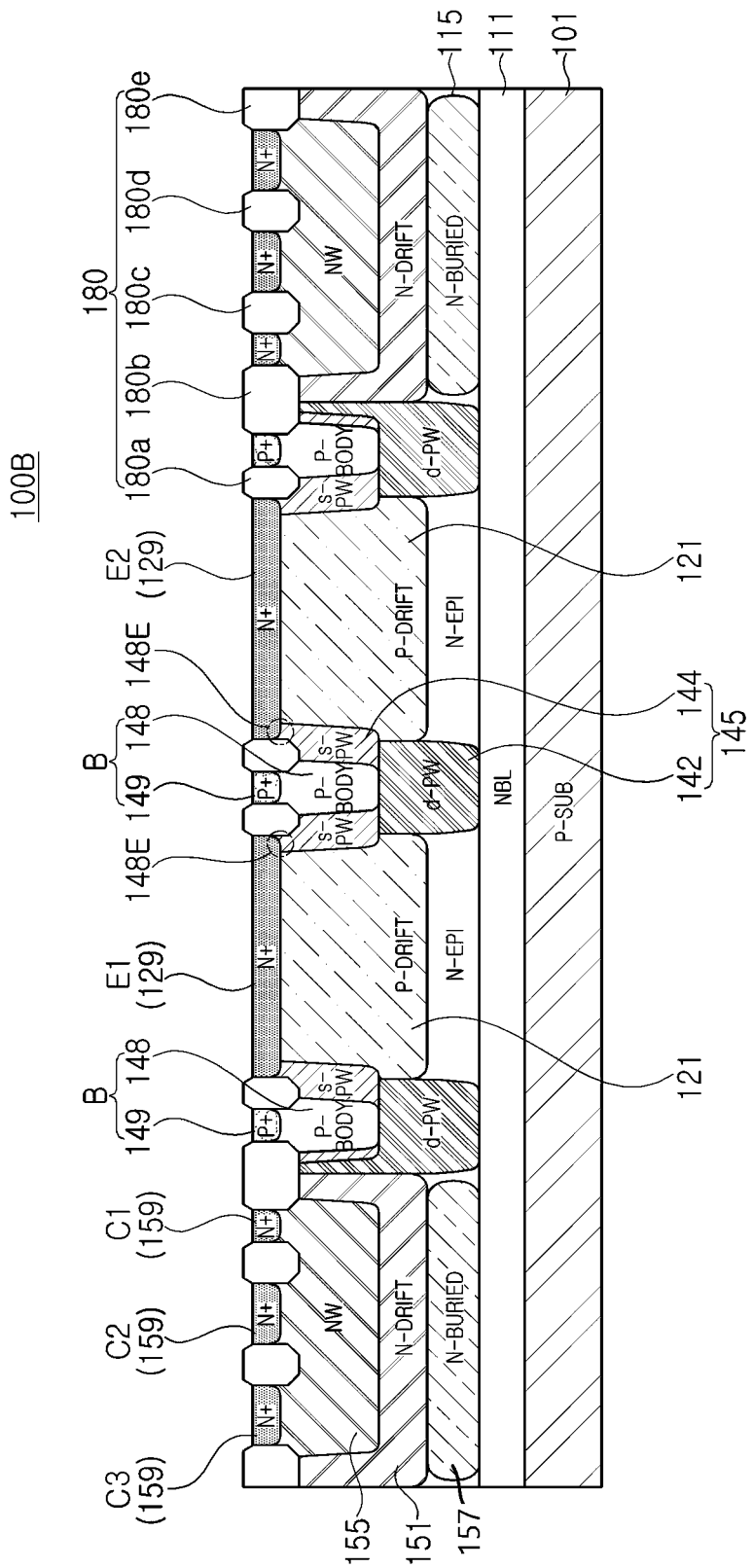
FIG. 13 is a cross-sectional view of the electrostatic discharge protection device of FIG. 12 taken along line IV-IV'.

FIG. 12 is a plan view of an electrostatic discharge protection device according to an example embodiment of the present inventive concept, and FIG. 13 is a cross-sectional view of the electrostatic discharge protection device of FIG. 12 taken along line IV-IV'.

Referring to FIGS. 12 and 13, it can be understood that an electrostatic discharge protection device 100B according to the present example embodiment has a structure, similar to the example embodiments shown in FIGS. 2 to 4, except that a collector region is composed of three collector regions C1, C2, and C3, a high-concentration first conductivity-type buried region 157 is further included in a first conductivity-type epitaxial layer 115 located below the three collector regions C1, C2, and C3. Accordingly, the description of the example embodiment shown in FIGS. 2 to 4 may be similar to or combined with the description of this example embodiment unless otherwise specified.

The electrostatic discharge protection device 100B according to the present example embodiment may include a first collector region C1, a second collector region C2, and a third collector region C3. The first collector region C1 may be configured to surround the base region B, the second collector region C2 may be configured to surround the first collector region C1, and the third collector region C3 may be configured to surround the second collector region C2. The first collector region C1, the second collector region C2, and the third collector region C3 may have different widths. For example, the width of the third collector region C3 located at the outermost side may be greater than the width of the other collector regions C1 and C2. The first conductivity-type (e.g., n-type) first emitter region E1 and the first conductivity-type (e.g., n-type) second emitter region E2, the base region B, and the first to third collector regions C1, C2, and C3 may be separated from each other by first to fifth isolations 180a, 180b, 180c, 180d, and 180e, respectively.

The electrostatic discharge protection device 100B according to the present embodiment may further include a first conductivity-type buried region 157 in a first conductivity-type epitaxial layer 115 located below the first conductivity-type drift region 151. The first conductivity-type epitaxial layer 115 is a low-concentration region, whereas the first conductivity-type buried region 157 may be provided as a high-concentration region. For example, the concentration of the first conductivity-type buried region 157 may range from $1 \times 10^{15}/cm^2$ to $1 \times 10^{16}/cm^2$.

In the present example embodiment, some collector regions (e.g., the third collector region C3) may have a current path connected to a second conductivity-type well region 145 through the first conductivity-type drift region 151, the first conductivity-type buried region 157, and the first conductivity-type buried layer 111. As described above, it can be driven similar to that of a vertical bipolar transistor. Meanwhile, in some other collector regions (e.g., the first collector region C1), it can have a current path through the second conductivity-type well region 145 through the first conductivity-type drift region 151, and may be driven similar to that of a lateral bipolar transistor by the current path.

As described above, the electrostatic discharge protection device 100B according to the present example embodiment may be driven by a lateral and vertical bipolar transistor having common first conductivity-type (e.g., n-type) first emitter region E1 and the first conductivity-type (e.g., n-type) second emitter region E2 and a common base region B together with the first collector region C1, the second collector region C2, and the third collector region C3.

As set forth above, by separating a plurality of collector regions from the collector region to substantially operate in a plurality of lateral BJT structures, a stable and high ESD current (It2) may be secured.

In addition, a deep current path may be formed by introducing P-type region having a new structure below the base region and the emitter region, and a desired holding voltage (Vh) and ESD current may be guaranteed by adjusting a concentration of each of the p-type regions. Spatially relative terms, such as "beneath," "below," "lower," "above," "upper," and the like, may be used herein for ease of description to describe one element's or feature's relationship to another element(s) or feature(s) as illustrated in the figures, but are intended to encompass different orientations of the device in use or operation in addition to the orientation depicted in the figures. The device may be otherwise oriented (rotated 90 degrees or at other orientations), and the spatially relative descriptors used herein may be interpreted accordingly.

Various and beneficial advantageous and effects of the present inventive concept are not limited to the above description, and may be more easily understood in the course of describing specific embodiments of the present inventive concept.

While example embodiments have been shown and described above, it will be apparent to those skilled in the art that modifications and variations could be made without departing from the scope of the present inventive concept as defined by the appended claims.

What is claimed is:

1. An electrostatic discharge protection device, comprising:
    an emitter region having a first conductivity-type on a semiconductor substrate;
    a base region having a second conductivity-type opposite to the first conductivity-type, and surrounding the emitter region on the semiconductor substrate;
    a first collector region having the first conductivity-type surrounding the base region on the semiconductor substrate;
    a second collector region having the first conductivity-type surrounding the first collector region on the semiconductor substrate;
    a second conductivity-type drift region surrounded by the base region, wherein the second conductivity-type drift region is between the emitter region and the semiconductor substrate, and extends toward the semiconductor substrate deeper than the base region;
    a second conductivity-type well region between the base region and the semiconductor substrate, and having a junction interface with the second conductivity-type drift region; and
    a plurality of isolation portions between the emitter region and the base region, between the base region and the first collector region, and between the first collector region and the second collector region, respectively, wherein:
        the second conductivity-type well region comprises a second conductivity-type deep well having the junction interface and having a first impurity concentration, and a second conductivity-type shallow well surrounding the base region in the second conductivity-type deep well and having a second impurity concentration that is higher than the first impurity concentration; and
        the base region comprises a high doped concentration region and a second conductivity-type body region within the second conductivity-type shallow well.

2. The electrostatic discharge protection device of claim 1, wherein the second conductivity-type deep well extends toward the semiconductor substrate deeper than the second conductivity-type drift region and is configured to define respective current paths between the emitter region and the first collector region and the second collector region deeper than the second conductivity-type shallow well.

3. The electrostatic discharge protection device of claim 1, wherein the second conductivity-type shallow well extends from an edge portion of the emitter region toward the semiconductor substrate.

4. The electrostatic discharge protection device of claim 1, wherein the first impurity concentration of the second conductivity-type deep well is higher than a third impurity concentration of the second conductivity-type drift region.

5. The electrostatic discharge protection device of claim 4, wherein the first impurity concentration of the second conductivity-type deep well is about $2.5\times10^{12}/cm^2$ to $5\times10^{12}/cm^2$, and the second impurity concentration of the second conductivity-type shallow well is about $2.5\times10^{13}/cm^2$ to $5\times10^{13}/cm^2$.

6. The electrostatic discharge protection device of claim 1, wherein the base region is configured to be electrically connected to the second conductivity-type deep well through the second conductivity-type shallow well.

7. The electrostatic discharge protection device of claim 6, wherein the base region comprises:
    wherein the second conductivity-type body region connects the high concentration doped region and the second conductivity-type deep well below the high concentration doped region, the second conductivity-type body region having a third impurity concentration that is lower than the second impurity concentration.

8. The electrostatic discharge protection device of claim 1, further comprising:
    a first conductivity-type impurity region surrounding both the first collector region and the second collector region below the first collector region and the second collector region, and having a junction interface with the second conductivity-type well region.

9. The electrostatic discharge protection device of claim 8, wherein the first conductivity-type impurity region comprises:
    a first conductivity-type well region surrounding both the first collector region and the second collector region, and having a fourth impurity concentration, and
    a first conductivity-type drift region surrounding the first conductivity-type well region, having the junction interface with the second conductivity-type well region, and having a fifth impurity concentration that is lower than the fourth impurity concentration.

10. The electrostatic discharge protection device of claim 9, wherein the fourth impurity concentration of the first conductivity-type well region is about $1\times10^{13}/cm^2$ to $5\times10^{13}/cm^2$, and the fifth impurity concentration of the first conductivity-type drift region is about $5\times10^{11}/cm^2$ to $1\times10^{12}/cm^2$.

11. The electrostatic discharge protection device of claim 1, wherein the emitter region comprises:
    a high concentration doped region; and
    a first conductivity-type drift region between the high concentration doped region and the second conductivity-type drift region.

12. The electrostatic discharge protection device of claim 1, wherein the second collector region has a width that is greater than that of the first collector region.

13. The electrostatic discharge protection device of claim 1, further comprising:
    a third collector region surrounding the second collector region.

14. An electrostatic discharge protection device, comprising:
    an emitter region on a semiconductor substrate;
    a base region surrounding the emitter region on the semiconductor substrate;
    a first collector region surrounding the base region on the semiconductor substrate;
    a second collector region surrounding the first collector region on the semiconductor substrate;
    a first conductivity-type well region surrounding both the first collector region and the second collector region, and having a first impurity concentration;

a first conductivity-type drift region surrounding the first conductivity-type well region, and having a second impurity concentration that is lower than the first impurity concentration;
a second conductivity-type well region between the base region and the semiconductor substrate, extending toward the semiconductor substrate deeper than the first conductivity-type drift region, and having a junction interface with the first conductivity-type drift region; and
a plurality of isolation portions between the emitter region and the base region, between the base region and the first collector region, and between the first collector region and the second collector region, respectively,
wherein the second conductivity-type well region comprises a second conductivity-type deep well having the junction interface and having a third impurity concentration, and a second conductivity-type shallow well surrounding the base region in the second conductivity-type deep well, and having a fourth impurity concentration that is higher than the third impurity concentration,
wherein the base region comprises a high concentration doped region, and a second conductivity-type body region connecting the high concentration doped region and the second conductivity-type deep well below the high concentration doped region, the second conductivity-type body region having a fifth impurity concentration lower than the fourth impurity concentration, and
wherein the second conductivity-type body region is within the second conductivity-type shallow well.

15. The electrostatic discharge protection device of claim 14, further comprising:
a first conductivity-type buried layer on the semiconductor substrate; and
a first conductivity-type epitaxial layer between the first conductivity-type buried layer and the first conductivity-type drift region.

16. The electrostatic discharge protection device of claim 15, further comprising:
a first conductivity-type buried region in the first conductivity-type epitaxial layer below the first conductivity-type drift region, and connecting the first conductivity-type drift region and the first conductivity-type buried layer.

17. An electrostatic discharge protection device, comprising:
an emitter region on a semiconductor substrate;
a base region surrounding the emitter region on the semiconductor substrate;
a first collector region surrounding the base region on the semiconductor substrate;
a second collector region surrounding the first collector region on the semiconductor substrate;
a first conductivity-type drift region surrounding both the first collector region and the second collector region and extending between the first collector region and the second collector region and the semiconductor substrate;
a second conductivity-type drift region surrounding the emitter region and extending between the emitter region and the semiconductor substrate;
a second conductivity-type deep well between the base region and the semiconductor substrate, extending toward the semiconductor substrate deeper than the first conductivity-type drift region and the second conductivity-type drift region, having a first junction interface and a second junction interface with the first conductivity-type drift region and the second conductivity-type drift region, respectively, and having a first impurity concentration;
a second conductivity-type shallow well surrounding the base region in the second conductivity-type deep well and having a second impurity concentration that is higher than the first impurity concentration; and
a plurality of isolation portions between the emitter region and the base region, between the base region and the first collector region, and between the first collector region and the second collector region, respectively,
wherein the base region comprises a high concentration doped region, and a second conductivity-type body region connecting the high concentration doped region and the second conductivity-type deep well below the high concentration doped region, the second conductivity-type body region having a third impurity concentration, higher than the first impurity concentration and lower than the second impurity concentration, and
wherein the second conductivity-type body region is within the second conductivity-type shallow well.

18. The electrostatic discharge protection device of claim 17, wherein:
the second conductivity-type deep well is configured to define respective current paths between the emitter region and the first collector region and the second collector region deeper than the second conductivity-type shallow well; and
the first impurity concentration of the second conductivity-type deep well is about $2.5 \times 10^{12}/\text{cm}^2$ to $5 \times 10^{12}/\text{cm}^2$, the second impurity concentration of the second conductivity-type shallow well is about $2.5 \times 10^{13}/\text{cm}^2$ to $5 \times 10^{13}/\text{cm}^2$, and the third impurity concentration of the second conductivity-type body region is about $1 \times 10^{13}/\text{cm}^2$ to $3.5 \times 10^{13}/\text{cm}^2$.

* * * * *